United States Patent
Lee

(10) Patent No.: US 8,023,357 B2
(45) Date of Patent: Sep. 20, 2011

(54) ADDRESS CONVERTING CIRCUIT AND SEMICONDUCTOR MEMORY DEVICE USING THE SAME

(75) Inventor: Kyong Ha Lee, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 107 days.

(21) Appl. No.: 12/459,362

(22) Filed: Jun. 30, 2009

(65) Prior Publication Data

US 2010/0246310 A1 Sep. 30, 2010

(30) Foreign Application Priority Data

Mar. 30, 2009 (KR) .................. 10-2009-0027000

(51) Int. Cl.
*G11C 8/00* (2006.01)
(52) U.S. Cl. .................. 365/230.08; 365/230.06
(58) Field of Classification Search ........... 365/230.08, 365/230.06
See application file for complete search history.

(56) References Cited

U.S. PATENT DOCUMENTS

| | | | | | |
|---|---|---|---|---|---|
| 5,581,762 | A | * | 12/1996 | Hayashi et al. | 717/144 |
| 5,644,749 | A | * | 7/1997 | Obayashi | 711/220 |
| 6,115,728 | A | * | 9/2000 | Nakai et al. | 708/404 |
| 7,281,114 | B2 | * | 10/2007 | Kita | 711/203 |
| 7,543,127 | B2 | * | 6/2009 | Kajihara | 711/163 |
| 7,657,724 | B1 | * | 2/2010 | DeHaemer | 711/202 |
| 2003/0088732 | A1 | * | 5/2003 | Tadroda et al. | 711/112 |
| 2007/0204129 | A1 | | 8/2007 | Nishino et al. | |

FOREIGN PATENT DOCUMENTS

KR 10-2009-0023244 A 3/2009

* cited by examiner

*Primary Examiner* — Michael T Tran
(74) *Attorney, Agent, or Firm* — John P. White; Cooper & Dunham LLP

(57) ABSTRACT

A semiconductor memory includes an address converting circuit which latches an address and a bank signal and generates a latch address for activating a data access path of a second bank group, and converts the latch address according to a level of the bank signal and generates a variable address for activating a data access path of a first bank group, a first column decoder which decodes the variable address and generates a first output enable signal for activating the data access path of the first bank group, and a second column decoder which decodes the latch address and generates a second output enable signal for activating the data access path of the second bank group.

17 Claims, 7 Drawing Sheets

ADDRESS CONVERTING CIRCUIT AND SEMICONDUCTOR MEMORY DEVICE USING THE SAME

TECHNICAL FIELD

This disclosure relates to a semiconductor memory device, and more particularly, to an address converting circuit and a semiconductor memory device using the same.

BACKGROUND

In recent times, manufacturing of semiconductor memory devices continuously advances toward high integration and high speed with development of technologies and such devices are used in a variety of products from large home appliances to small mobile products.

Address paths of semiconductor memory devices include a row address path through which a word line is selected by a row address and data stored in all cells connected to the selected word line are loaded on bit line pairs and amplified by a sense amplifier, and a column address path through which one of a plurality of the bit line pairs is selected by a column address and the selected data are read or written.

Also, such column address path is divided into a data access path through which one of a plurality of output enable signals is selectively enabled to select one of the plurality of the bit line pairs loading the data thereon, and a data transfer path through which the selected data are read or written. Among these, operation of controlling the data access path (hereinafter, referred to as 'data access operation') is performed by a data access control circuit, including a column decoder, that decodes the column address and selectively enables one of the plurality of output enable signals to allow the selected data to be read or written.

In general, a semiconductor memory device such as a DRAM includes a plurality of banks having respective memory cells to which a same address is assigned. This semiconductor memory device simultaneously outputs data in the memory cells of the same address included in each bank. To this end, the data access control circuit decodes the column address and selectively enables one of the plurality of the output enable signals, and performs operation of transferring the data loaded on the bit line pair selected in the bank enabled by the output enable signal.

SUMMARY

In an aspect of this disclosure, there is provided a method of controlling a data access path in a semiconductor memory device consisting of a plurality of banks so as to sequentially input/output data according to a sequence of the bank.

In another aspect of this disclosure, there is provided an address converting circuit which allows sequential input/output of data according to a sequence of a bank in a semiconductor memory device including a plurality of banks, and a semiconductor memory device using the same.

In an embodiment, an address converting circuit includes an address latch unit which latches an address and a bank signal and generates a latch address for activating a data access path of a second bank group and a latch bank signal, and a variable address generation unit which converts the latch address and generates a variable address for activating a data access path of a first bank group.

BRIEF DESCRIPTION OF THE DRAWINGS

The above and other aspects, features and advantages will be more clearly understood from the following detailed description taken in conjunction with the accompanying drawings, in which.

DESCRIPTION OF PREFERRED EMBODIMENTS

Hereinafter, embodiments of the present invention will be described with reference to accompanying drawings. However, the embodiments are for illustrative purposes only and are not intend to limit the scope of the invention.

Figure 1:
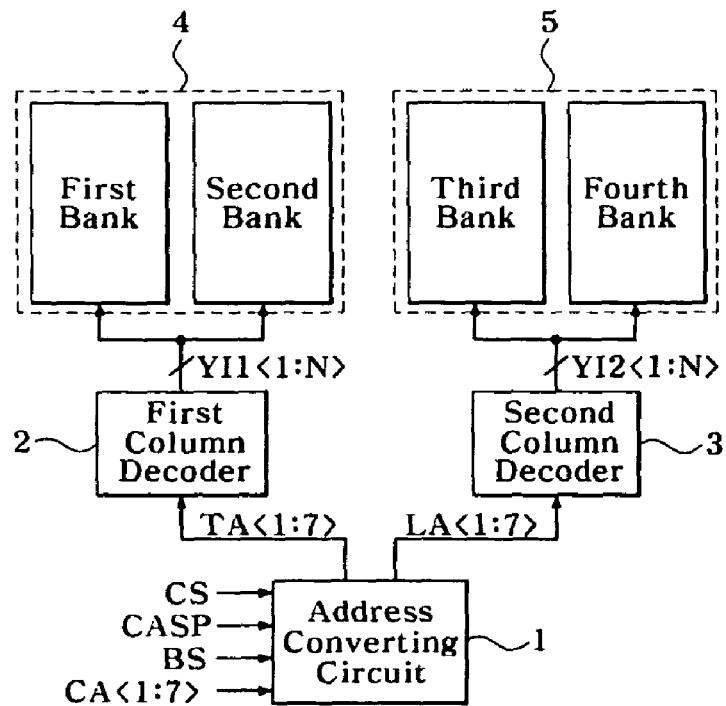
FIG. 1 is a block diagram illustrating a configuration of a data access control circuit in accordance with an embodiment of the present invention.

FIG. 1 is a block diagram illustrating a configuration of a semiconductor memory device in accordance with an embodiment of the present invention.

The semiconductor memory device of the present invention includes, as illustrated in FIG. 1, an address converting circuit 1, a first column decoder 2, a second column decoder 3, a first bank group 4 and a second bank group 5.

The first bank group 4 includes a first bank and a second bank, and the second bank group includes a third bank and a fourth bank.

In an embodiment of the present invention, a priority related to a sequence of data input/output can be set between the first bank group 4 and the second bank group 5, wherein the first bank group 4 becomes a major priority and the second bank group 5 becomes a minor priority. That is to say, when data access paths of the first bank group 4 and the second bank group 5 are activated by the same column address, the input/output of the data is performed in sequence of the first bank group 4 and the second bank group 5.

Figure 2:
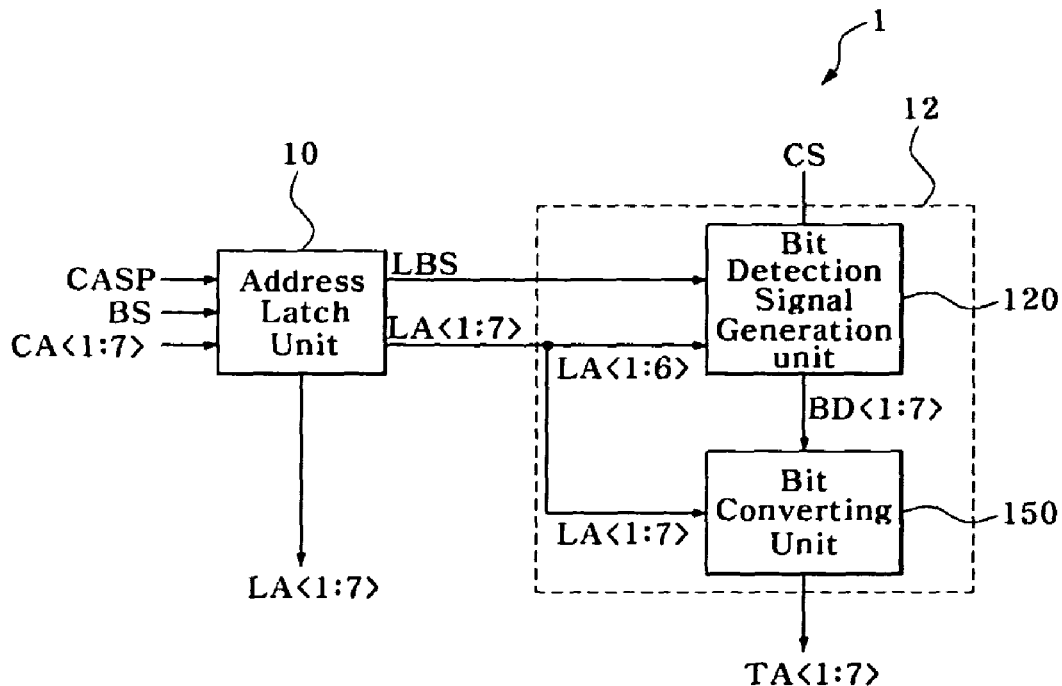
FIG. 2 is a block diagram illustrating an address converting circuit in the data access control circuit of FIG. 1.

Meanwhile, the address converting circuit 1 includes, as illustrated in FIG. 2, an address latch unit 10 and a variable address generation unit 12 having a bit detection signal generation unit 120 and a bit converting unit 150.

Figure 3:
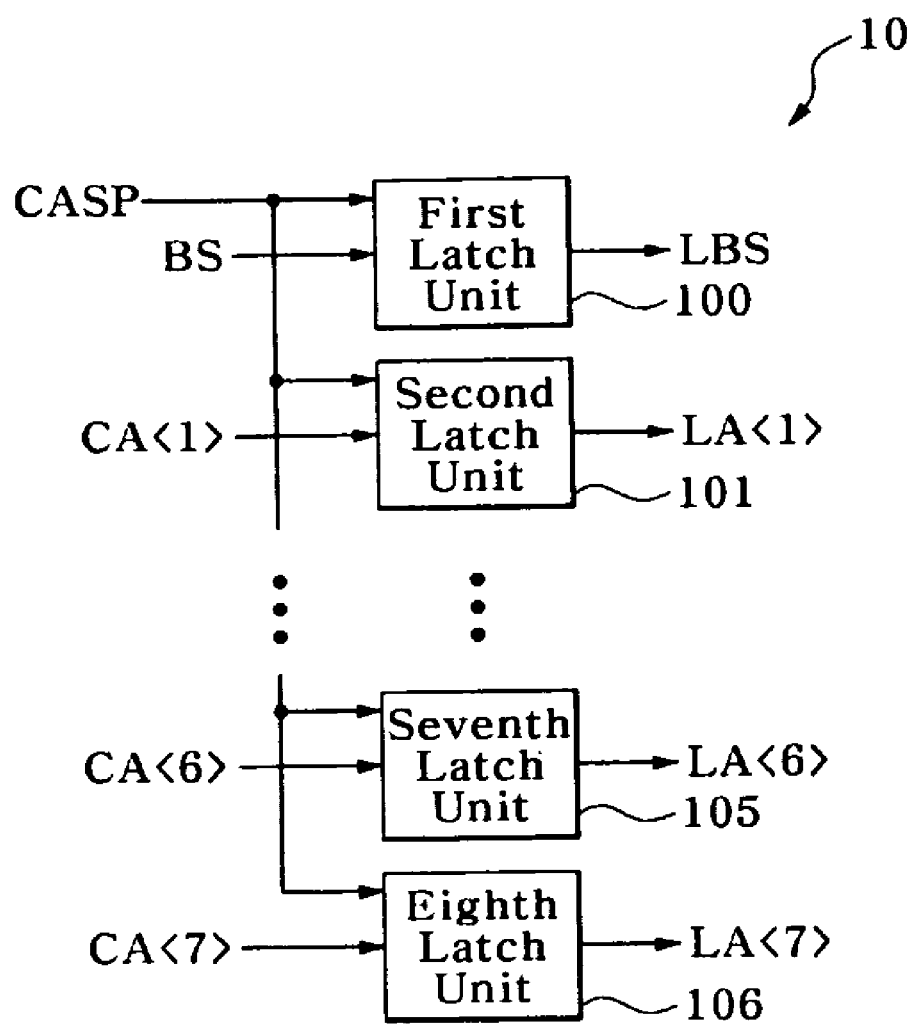
FIG. 3 is a block diagram illustrating an address latch unit in the address converting circuit of FIG. 2.

The address latch unit 10 includes, as illustrated in FIG. 3, first through eighth latch units 100-106.

Figure 4A:
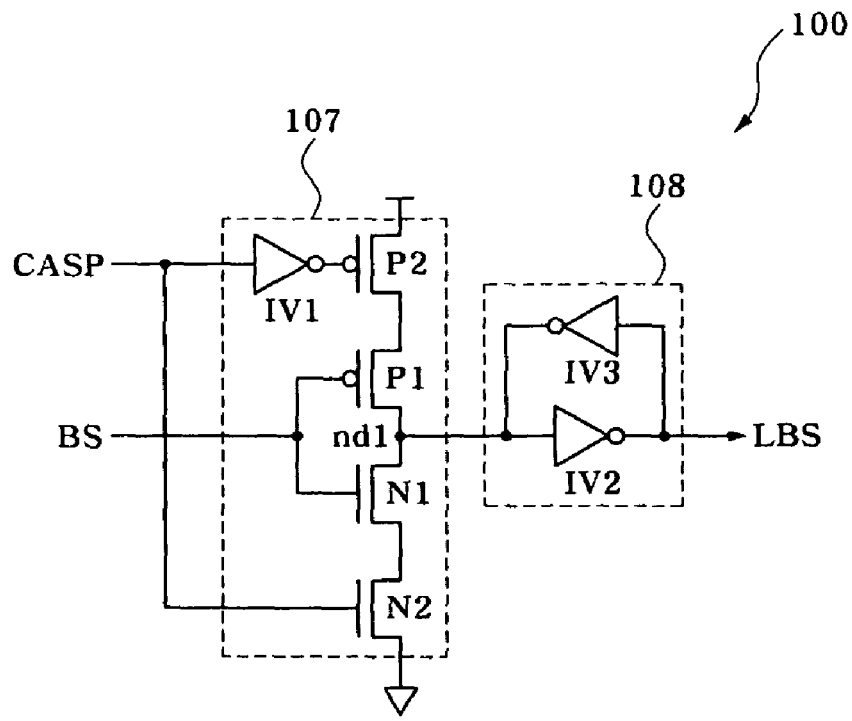
FIG. 4A is a circuit diagram illustrating a first latch unit in the address latch unit of FIG. 3.

The first latch unit 100 includes, as illustrated in FIG. 4A, a first drive unit 107 which drives the node nd1 according to a level of the bank signal BS in response to a CAS signal CASP, and a first latch 108 which latches a signal of the node nd1 and generates a latch bank signal LBS. That is to say, the first latch unit 100 buffers the bank signal BS in response to the CAS signal CASP and generates the latch bank signal LBS.

The first drive unit 107 includes a PMOS transistor P1 and an NMOS transistor N1 selectively turned on in response to the bank signal BS and a PMOS transistor P2 and an NMOS transistor N2 turned on in response to the CAS signal CASP.

Here, the CAS signal CASP is enabled to activate the data access path of the bank and the bank signal BS is for selecting a sequence of the data input/output between the first bank group 4 and the second bank group 5. The data is inputted or outputted in sequence of the first bank group 4 and the second bank group 5 when the bank signal BS is at a low level and the data is inputted or outputted in sequence of the second bank group 5 and the first bank group 4 when the bank signal BS is at a high level.

Figure 4B:
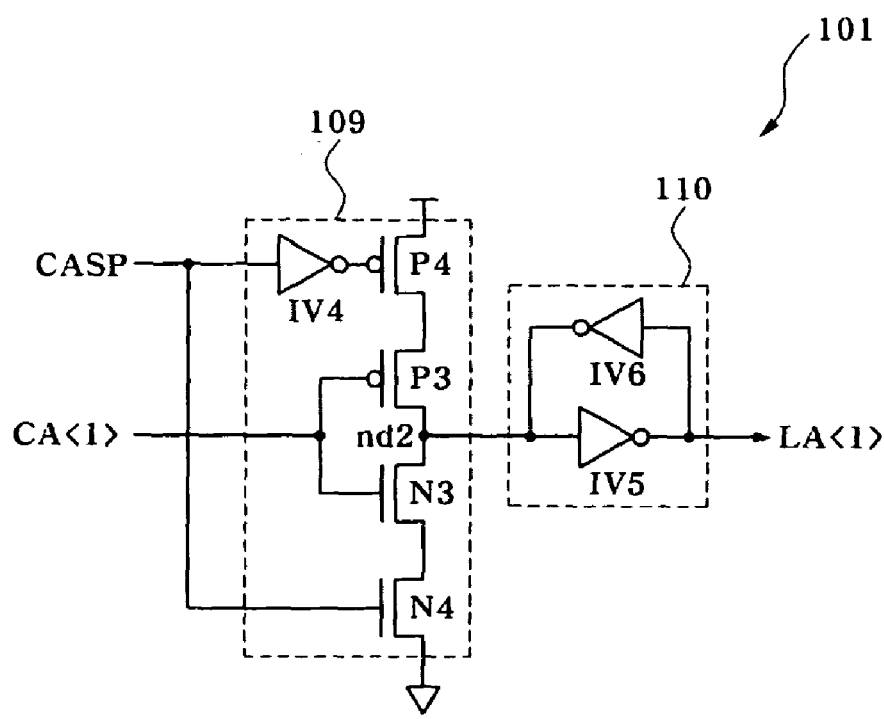
FIG. 4B is a circuit diagram illustrating a second latch unit in the address latch unit of FIG. 3.

The second latch unit 101 buffers first column address CA<1> in response to the CAS signal CASP and generates a first latch address LA<1>, and includes, as illustrated in FIG. 4B, a second drive unit 109 which drives a node nd2 according to a level of first column address CA<1> in response to the CAS signal CASP, and a second latch 110 which latches a signal of the node nd2 and generates the first latch address LA<1>. The third through eighth latch units 102-106 have the same configuration as the second latch unit 101 and thus will not be described repeatedly.

The address latch unit 10 configured as described above buffers the bank signal BS in response to the CAS signal CASP and generates the latch bank signal LBS, and buffers first through seventh column addresses CA<1:7> and generates first through seventh latch addresses LA<1:7>.

Figure 5:
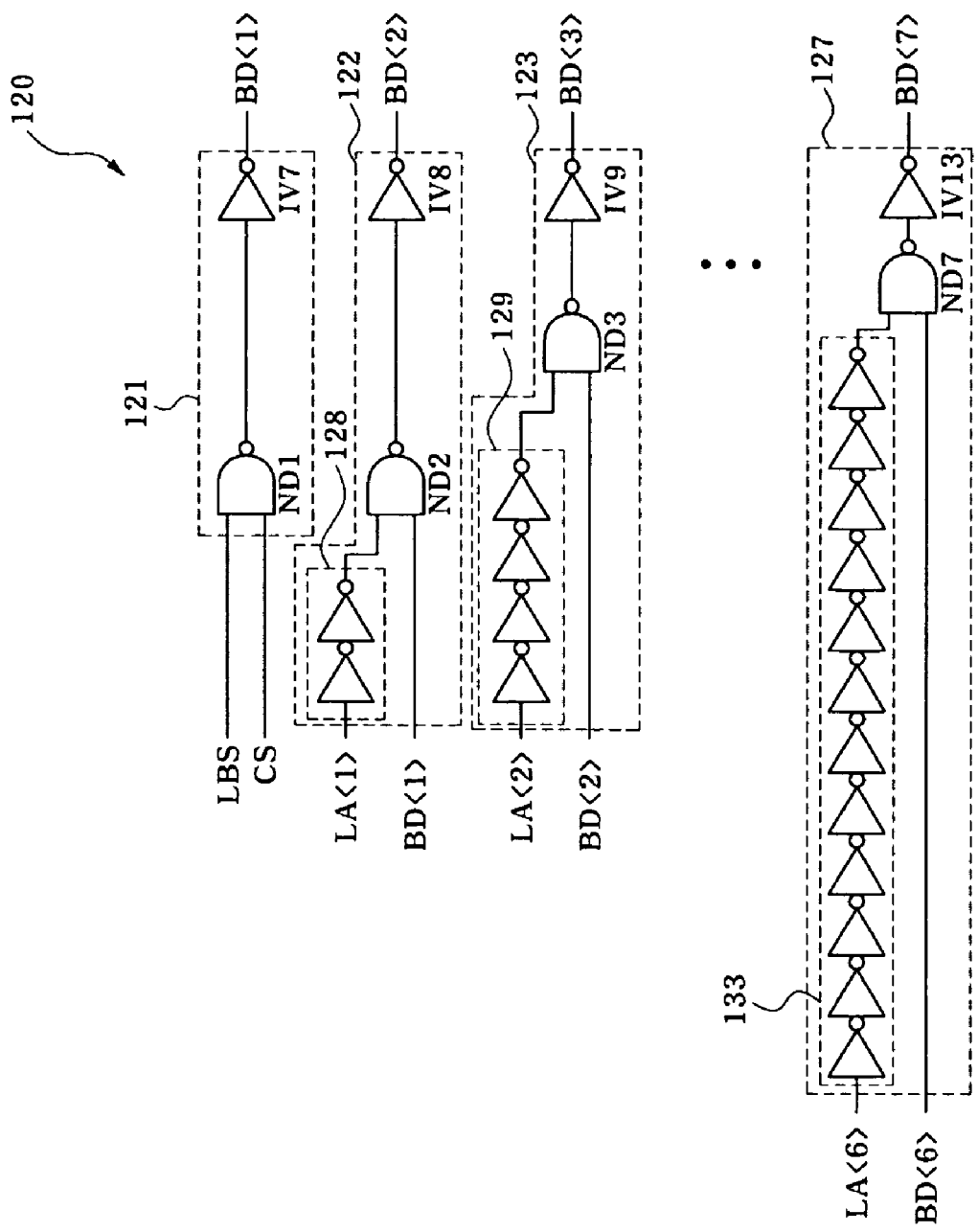
FIG. 5 is a circuit diagram illustrating a bit detection signal generation unit in the address converting circuit of FIG. 2.

Meanwhile, the bit detection signal generation unit 120 of the variable address generation unit 12 includes, as illustrated in FIG. 5, first through seventh bit detection signal generation units 121-127.

The first bit detection signal generation unit 121 includes a NAND gate ND1 which performs a logic NAND operation on the latch bank signal LBS generated by buffering the bank signal BS and a control signal CS, and an inverter IV7 which inverts an output signal of the NAND gate ND1 and generates a first bit detection signal BD<1>. Here, the control signal CS is enabled to a high level for supporting operation of sequentially inputting/outputting data according to the sequence of the bank. Hereinafter, the control signal CS is assumed to be maintained at a high level. That is to say, the first bit detection signal BD<1> is enabled to a high level when the latch bank signal LBS is at a high level.

The second bit detection signal generation unit 122 includes a NAND gate ND2 which performs a logic NAND operation on the first latch address LA<1> delayed and buffered through the buffer unit 128 and the first bit detection signal BD<1>, and an inverter IV8 which inverts an output signal of the NAND gate ND2 and generates a second bit detection signal BD<2>. That is to say, the second bit detection signal BD<2> is enabled to a high level when the first bit detection signal BD<1> is enabled to a high level and the first latch address LA<1> is at a high level.

The third bit detection signal generation unit 123 includes a NAND gate ND3 which performs a logic NAND operation on the second latch address LA<2> delayed and buffered through the buffer unit 129 and the second bit detection signal BD<2>, and an inverter IV9 which inverts an output signal of the NAND gate ND3 and generates a third bit detection signal BD<3>. That is to say, the third bit detection signal BD<3> is enabled to a high level when the second bit detection signal BD<2> is enabled to a high level and the second latch address LA<2> is at a high level. Next, the fourth through seventh bit detection signal generation units 124-127 have the same configuration as the second and third bit detection signal generation units 122, 123, and thus will not be described repeatedly.

The bit detection signal generation unit 120 configured as described above sequentially generates the first through seventh bit detection signals BD<1:7> in response to the first through sixth latch addresses LA<1:6> according to the level of the latch bank signal LBS. More specifically, the bit signal generation unit 120 generates the first through seventh bit detection signals BD<1:7> which are sequentially disabled to a low level when the latch bank signal LBS is at a low level. Also, when the latch bank signal LBS is at a high level, the first through seventh bit detection signals BD<1:7> are sequentially enabled to a high level. However, when one of the first through sixth latch addresses LA<1:6> is inputted at a low level for the first time, the bit detection signal BD<1:7> corresponding to the latch address LA<1:6> and the bit detection signals BD<1:7> which are more significant bits thereof are sequentially disabled to a low level. For example, when the first latch address LA<1> is at a high level and the second latch address LA<2> which is the more significant bit thereof is inputted at a low level for the first time, the third bit detection signal BD3 corresponding thereto is disabled to a low level and the fourth through seventh bit detection signals BD<4:7> which are more significant bits thereof are sequentially disabled to a low level.

Figure 6:
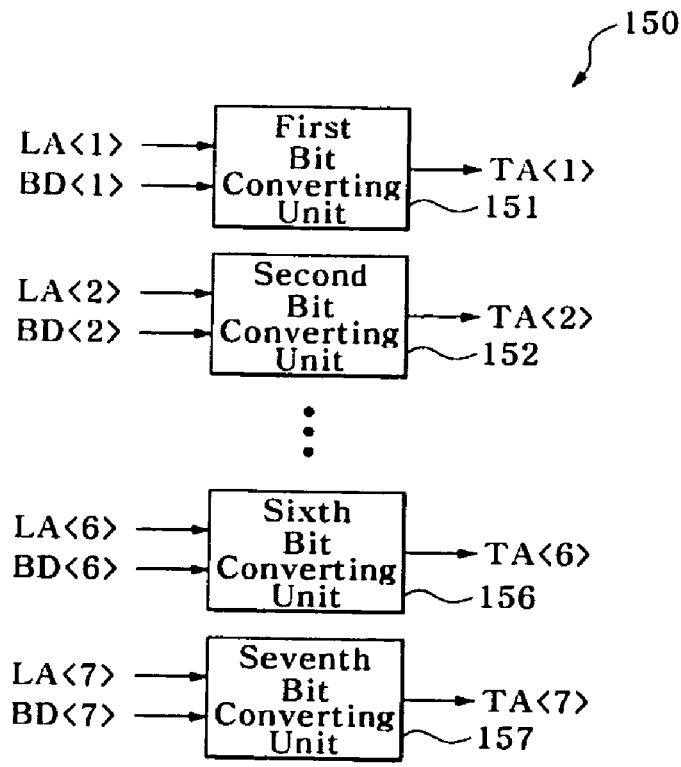
FIG. 6 is a block diagram illustrating a bit converting unit in the address converting circuit of FIG. 2.

The bit converting unit 150 includes, as illustrated in FIG. 6, first through seventh bit converting units 151-157 which convert the level of the first through seventh latch addresses LA<1:7>, respectively, and generate first through seventh variable addresses TA<1:7>, respectively, in response to the first through seventh bit detection signals BD<1:7>, respectively.

Figure 7:
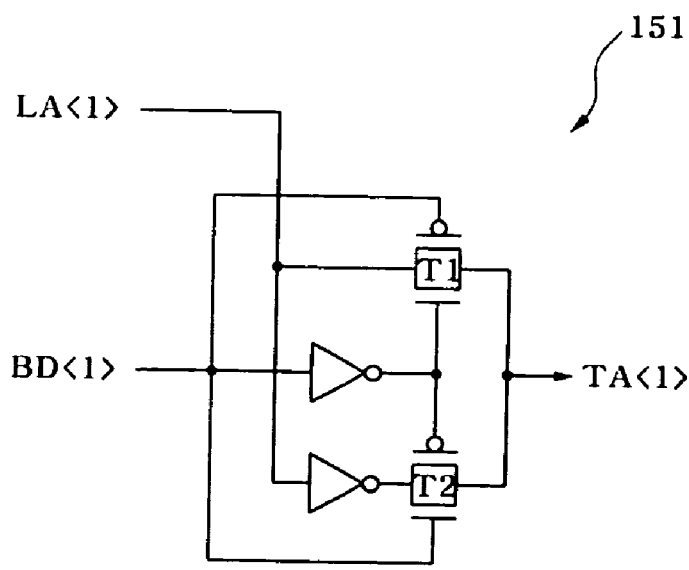
FIG. 7 is a circuit diagram illustrating a first bit converting unit in the bit converting unit of FIG. 6.

First, the first bit converting unit 151 includes, as illustrated in FIG. 7, a transfer gate T1 and a transfer gate T2 which selectively transfer the first latch address LA<1> as the first variable address TA<1> in response to the level of the first bit detection signal BD<1>. The second through seventh bit converting units 152-157 have similar configurations as the first bit converting unit 151 and thus will not be described repeatedly.

The bit converting unit 150 configured as described above maintains or inverts the level of the first through seventh latch addresses LA<1:7> according to the level of the first through seventh bit detection signals BD<1:7>, respectively, and transfers them as the first through seventh variable addresses TA<1:7>, respectively. Here, the first through seventh variable addresses TA<1:7> generated when the latch bank signal LBS is at a high level are the addresses generated by up-counting the first through seventh latch addresses LA<1:7> by one bit.

The variable address generation unit 12 configured as described above transfers the first through seventh latch addresses LA<1:7>, as they are as the first through seventh variable addresses TA<1:7>, respectively, when the latch bank signal LBS is at a low level, and generates the first through seventh variable addresses TA<1:7> by up-counting the first through seventh latch addresses LA<1:7> by one bit when the latch bank signal LBS is at a high level.

Figure 8:
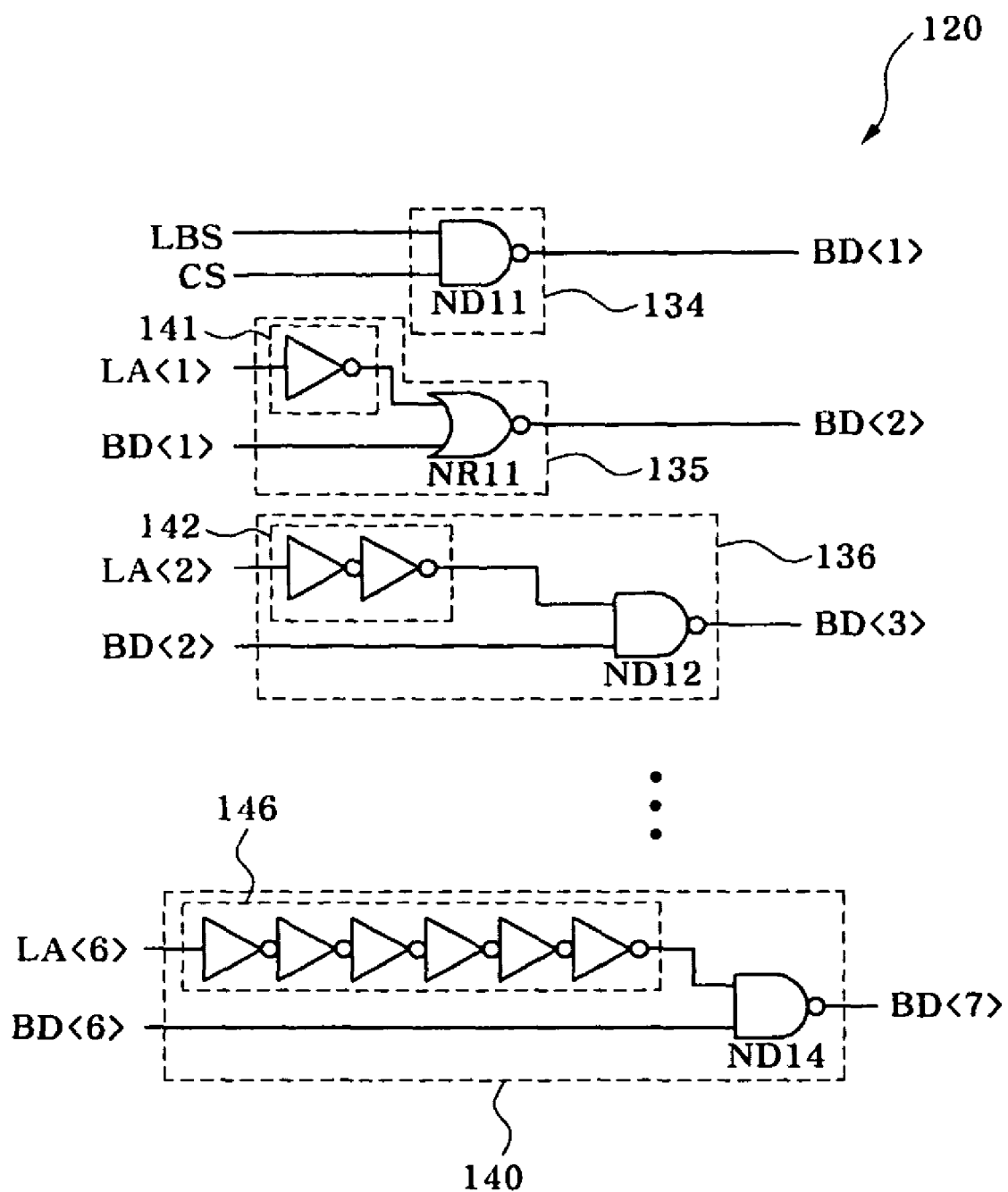
FIG. 8 is a circuit diagram of another example of the bit detection signal generation unit in the address converting circuit of FIG. 2.

Meanwhile, another example of the bit detection signal generation unit 120 with a reduced number of inverters and with a resulting simple configuration is illustrated in FIG. 8 since the bit detection signal generation unit 120 illustrated in FIG. 5 includes a large number of inverters.

The bit detection signal generation unit illustrated in FIG. 8 includes first through seventh bit detection signal generation units 134-140.

The first bit detection signal generation 134 includes a NAND gate ND11 which performs a logic NAND operation on the latch bank signal LBS and the control signal CS and generates the first bit detection signal BD<1>. That is to say, the first bit detection signal BD<1> is enabled to a low level when the latch bank signal LBS is at a high level.

The second bit detection signal generation unit 135 includes a NOR gate NR11 which performs a logic NOR operation on the first latch address LA<1> inverted and buffered through the buffer unit 141 and the first bit detection signal BD<1> and generates the second bit detection signal BD<2>. That is to say, the second bit detection signal BD<2> is enabled to a high level when the first bit detection signal BD<1> is enabled to a low level and the first latch address LA<1> is at a high level.

The third bit detection signal generation unit 136 includes a NAND gate ND12 which performs a logic NAND operation on the second latch address LA<2> buffered through the buffer unit 142 and the second bit detection signal BD<2> and generates the third bit detection signal BD<3>. That is to say, the third bit detection signal BD<3> is enabled to a low level when the second bit detection signal BD<2> is enabled to a high level and the second latch address LA<2> is at a high level. The rest, i.e., the fourth through seventh bit detection signal generation units 137-140 have similar configurations as the first through third bit detection signal generation units 134-136, and thus will not be described repeatedly.

The bit detection signal generation unit 120 configured as illustrated in FIG. 8 and described above has a characteristic in that the numbers of the inverters included in the buffer units 141-146 are one-half of those in buffers 128-133 (FIG. 5) since the NAND gates ND11-ND14 and the NOR gates NR11-NR13 are alternately used in the first through seventh bit detection signal generation units 134-140. However, the first through seventh bit converting units 151-157 should be configured in two forms since the first, third, fifth and seventh bit detection signals BD<1,3,5,7> become a low enable signal and the second, fourth and sixth bit detection signals BD<2,4,5> become a high enable signal.

Figure 9:
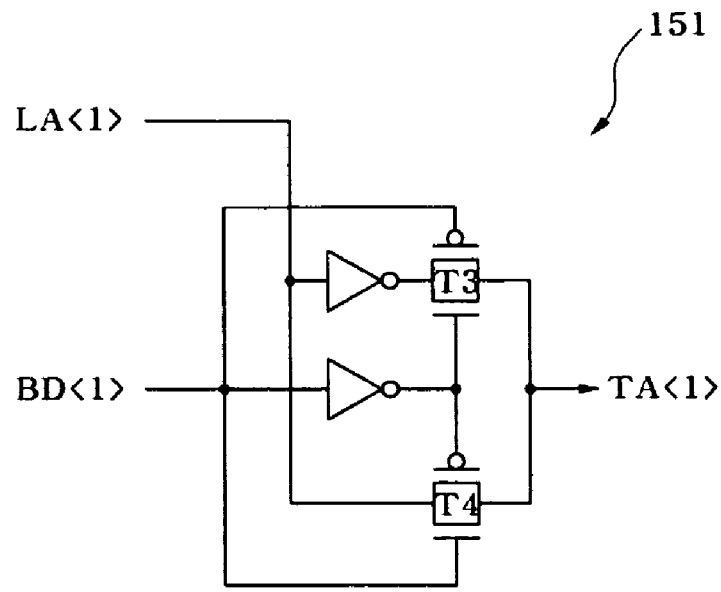
FIG. 9 is a circuit diagram illustrating a first bit converting unit in the bit detection signal generation unit of FIG. 8.

The first bit converting unit 151 in accordance with another example of the bit converting unit 150 includes, as illustrated in FIG. 9, a transfer gate T3 and a transfer gate T4 which selectively transfer the first latch address LA<1> according to the level of the first bit detection signal BD<1>. This first bit converting unit 151 is configured in the same manner as the third, fifth and seventh bit converting units 153, 155, 157.

Figure 10:
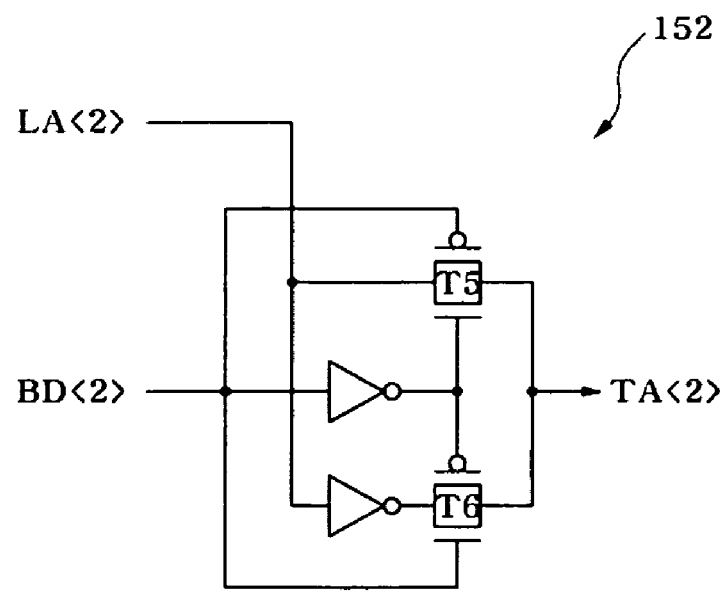
FIG. 10 is a circuit diagram illustrating a second bit converting unit in the bit detection signal generation unit of FIG. 8.

The second bit converting unit 152 includes, as illustrated in FIG. 10, a transfer gate T5 and a transfer gate T6 which selectively transfer the second latch address LA<2> as the second variable address TA<2> in response to the level of the second bit detection signal BD<2>. This second bit converting unit 152 is configured in the same manner as the fourth and sixth bit converting units 154, 156.

As such, the bit converting unit 150 with alternate configurations of the bit converting units maintains or inverts the level of the first through seventh latch addresses LA<1:7> according to the level of the first through seventh bit detection signals BD<1:7>, respectively, and transfers them as the first through seventh variable addresses TA<1:7>, respectively. Here, the first through seventh variable addresses TA<1:7> generated when the latch bank signal LBS is at a high level is the addresses generated by up-counting the first through seventh latch addresses LA<1:7> by one bit.

Operations of the semiconductor memory device in accordance with the present invention configured as described above will be described hereinafter with respect to when the bank signal BS is at a low level and high level, respectively.

First, operation of the semiconductor memory device when the bank signal BS is at a low level is described. At this time, the data is inputted or outputted in a sequence of the first bank group 4 followed by the second bank group 5.

Referring to FIGS. 1 through 4B, the address latch unit 10 buffers the bank signal BS of a low level and generates the latch bank signal LBS of a low level in response to the CAS signal CASP, and the second through eighth latch unit 101-106 buffer the first through seventh column addresses CA<1:7>, respectively, and generate the first through seventh latch addresses LA<1:7>, respectively.

The variable address generation unit 12 outputs the first through seventh latch addresses LA<1:7> as the first through seventh variable addresses TA<1:7>, respectively, in response to the latch bank signal LBS of a low level. Specifically, the bit signal generation unit 120 receives the latch bank signal LBS of a low level and generates the first through seventh bit detection signals BD<1:7> which are sequentially disabled to a low level. Referring to FIGS. 6 and 7, the first through seventh bit converting units 151-157 transfer the first through seventh latch addresses LA<1:7>, as they are, as the first through seventh variable addresses TA<1:7>, respectively, in response to the first through seventh bit detection signals BD<1:7>, respectively, all of which are disabled to a low level. That is to say, the address converting circuit 1 outputs the first through seventh latch addresses LA<1:7>and the first through seventh variable addresses TA<1:7>as the same addresses when the latch bank signal LBS is at a low level.

Meanwhile, the first column decoder 2 decodes the first through seventh variable addresses TA<1:7>and generates a first output enable signal YI1<1:N> which activates the data access path of the first bank group 4, and the second column decoder 3 decodes the first through seventh latch addresses LA<1:7> and generates a second output enable signal YI2<1:N> which activates the data access path of the second bank group 5. At this time, the first column decoder 2 and the second column decoder 3 generate the first output enable signal YI1<1:N> and the second output enable signal YI2<1:N>, respectively, by the same address. Therefore, the data access paths of the first bank group 4 and the second bank group 5 are activated by the same column address and thus the data is inputted or outputted in a sequence of the first bank group 4 followed by the second bank group 5.

Next, the operation of the semiconductor memory device when the bank signal BS is at a high level is described. At this time, the data is inputted or outputted in sequence of the second bank group 5 followed by the first bank group 4.

Referring to FIGS. 2 through 4B, the address latch unit 10 buffers the bank signal BS of a high level in response to the CAS signal CASP and generates the latch bank signal LBS of a high level, and buffers first through seventh column addresses CA<1:7> and generates first through seventh latch addresses LA<1:7>.

The variable address generation unit 12 up-counts the first through seventh latch addresses LA<1:7> by one bit and generates the first through seventh variable addresses TA<1:7> in response to the latch bank signal LBS of a high level. Specifically, referring to FIG. 5, the first bit detection signal generation unit 121 generates the first bit detection signal BD<1> enabled to a high level in response to the bank latch signal LBS of a high level. After that, when one of the second through seventh bit detection signals BD<2:7> is disabled to a low level in response to a latch address of the first through seventh latch addresses LA<1:7> that is inputted at a low level for the first time, all of the bit detection signals that are more significant bits thereof are sequentially disabled to a low level. For example, when the first latch address LA<1> or the less significant bit is at a high level and the second latch address LA<2> or the more significant bit is at a low level, the third bit detection signal BD3 and the fourth through seventh bit detection signals BD<4:7> which are more significant bits are sequentially disabled to a low level.

Referring to FIGS. 6 and 7, the first through seventh bit converting units 151-157 maintain or invert the level of the first through seventh latch addresses LA<1:7>, respectively, according to the level of the first through seventh bit detection signals BD<1:7>, respectively, and transfer them as the first through seventh variable addresses TA<1:7>, respectively. For example, the first bit converting unit 151 transfers the first latch address LA<1>, as it is, as the first variable address TA<1> when the first bit detection signal BD<1> is at a low level, and inverts the first latch address LA<1> and transfers the inverted first latch address as the first variable address TA<1> when the first bit detection signal BD<1> is at a high level. As such, the first through seventh variable addresses TA<1:7> generated in the bit converting unit 150 are the addresses generated by up-counting the first through seventh latch addresses LA<1:7> by one bit.

Meanwhile, the first column decoder 2 decodes the first through seventh variable addresses TA<1:7> and generates a first output enable signal YI1<1:N> which activates the data access path of the first bank group 4, and the second column decoder 3 decodes the first through seventh latch addresses LA<1:7> and generates a second output enable signal YI2<1:N> which activates the data access path of the second bank group 5. At this time, the first column decoder 2 decodes the address up-counted by one bit as compared to the first through seventh latch addresses LA<1:7> decoded by the second column decoder 3, and generates the first output enable signal YI1<1:N>. Therefore, the data access path through which the data of a next order is inputted or outputted is activated in the first bank group 4, and the data is inputted or outputted in a sequence of the second bank group 5 followed by the first bank group 4.

As described above, the semiconductor memory device in accordance with the present invention includes the first bank group 4 and the second bank group 5 in which a priority related to a sequence of data input/output is set therebetween. When the bank signal BS is at a low level, the data is inputted or outputted in a sequence of the first bank group 4 followed by the second bank group 5, and, at this time, the data access paths of the first bank group 4 and the second bank group 5 are activated by the same column address. Also, when the bank signal BS is at a high level, the data is inputted or outputted in a sequence of the second bank group 5 followed by the first bank group 4, and, at this time, the data access path is activated by the address generated by up-counting the address for activating the data access path of the second bank group 2 by one bit so that the data of next order is inputted in or outputted from the first bank group 4.

While the present invention has been described with respect to the specific embodiments and examples, it will be apparent to those skilled in the art that various changes and modifications may be made without departing from the spirit and scope of the invention as defined in the following claims.

The present disclosure claims priority to Korean application number 10-2009-0027000, filed on Mar. 30, 2009, the entire contents of which are incorporated herein by reference.

What is claimed is:

1. An address converting circuit, comprising:
    a first latch unit which buffers a bank signal and generates a latch bank signal;
    a second latch unit which buffers an address and generates a latch address for activating a data access path of a second bank group and a latch bank signal; and
    a variable address generation unit which converts the latch address and generates a variable address for activating a data access path of a first bank group.

2. The address converting circuit of claim 1, wherein input/output of data is performed in a first sequence of the first bank group followed by the second bank group when the latch bank signal is at a first level, and the input/output of the data is performed in a second sequence of the second bank group followed by the first bank group when the latch bank signal is at a second level.

3. The address converting circuit of claim 2, wherein the variable address generation unit outputs the latch address as the variable address when the latch bank signal is at the first level.

4. The address converting circuit of claim 2, wherein the variable address generation unit generates the variable address by up-counting the latch address when the latch bank signal is at the second level.

5. The address converting circuit of claim 2, wherein the variable address generation unit includes:
    a bit detection signal generation unit for generating a bit detection signal in which all bits are sequentially disabled when the latch bank signal is at the first level and a bit corresponding to a bit of the latch address inputted at the first level for the first time and more significant bits thereof are sequentially disabled when the latch bank signal is at the second level; and
    a bit converting unit which converts the latch address and generates the variable address in response to the bit detection signal.

6. A semiconductor memory, comprising:
    an address converting circuit which buffers an address and a bank signal and generates a latch address for activating a data access path of a second bank group, and converts the latch address according to a level of the bank signal and generates a variable address for activating a data access path of a first bank group;
    a first column decoder which decodes the variable address and generates a first output enable signal for activating the data access path of the first bank group; and
    a second column decoder which decodes the latch address and generates a second output enable signal for activating the data access path of the second bank group,
    wherein input/output of data is performed in a first sequence of the first bank group followed by the second bank group when the bank signal is at a first level, and the input/output of the data is performed a second in sequence of he second bank group followed by the first bank group when the bank signal is at a second level.

7. The semiconductor memory device of claim 6, wherein the address converting circuit outputs the latch address as the variable address when the bank signal is at the first level.

8. The semiconductor memory device of claim 6, wherein the address converting circuit generates the variable address by up-counting the latch address when the bank signal is at the second level.

9. The semiconductor memory device of claim 6, wherein the address converting circuit includes:

an address latch unit which latches the address and the bank signal and generates the latch address for activating the data access path of the second bank group and a latch bank signal; and a variable address generation unit which converts the latch address and generates the variable address for activating the data access path of the first bank group.

10. The semiconductor memory device of claim 9, wherein the address latch unit includes:

a first latch unit which buffers the bank signal and generates the latch bank signal; and a second latch unit which buffers the address and generates the latch address.

11. The semiconductor memory device of claim 9, wherein the variable address generation unit includes:

a bit detection signal generation unit for generating a bit detection signal in which all bits are sequentially disabled when the latch bank signal is at the first level and a bit corresponding to a bit of the latch address inputted at the first level for the first time and more significant bits thereof are sequentially disabled when the latch bank signal is at the second level; and a bit converting unit which converts the latch address and generates the variable address in response to the bit detection signal.

12. A semiconductor memory device, comprising:

a first latch unit which buffers a bank signal and generates a latch bank signal;

a second latch unit which buffers an address and generates a latch address for activating a data access path;

a variable address generation unit which converts the latch address and generates a variable address for activating a data access path in response to the latch bank signal;

a first column decoder which decodes the variable address and generates a first output enable signal;

a second column decoder which decodes the latch address and generates a second output enable signal;

a first bank group inputting or outputting data through a data access path activated by the first output enable signal; and a second bank group inputting or outputting data through a data access path activated by the second output enable signal.

13. The semiconductor memory device of claim 12, wherein input/output of data is performed in a first sequence of the first bank group followed by the second bank group when the latch bank signal is at a first level, and the input/output of the data is performed in a second sequence of the second bank group followed by the first bank group when the latch bank signal is at a second level.

14. The semiconductor memory device of claim 13, wherein the variable address generation unit outputs the latch address as the variable address when the latch bank signal is at the first level.

15. The semiconductor memory device of claim 13, wherein the variable address generation unit generates the variable address by up-counting the latch address when the latch bank signal is at the second level.

16. The semiconductor memory device of claim 13, wherein the variable address generation unit includes:

a bit detection signal generation unit for generating a bit detection signal in which all bits are sequentially disabled when the latch bank signal is at the first level and a bit corresponding to a bit of the latch address inputted at the first level for the first time and more significant bits thereof are sequentially disabled when the latch bank signal is at the second level; and a bit converting unit which converts the latch address and generates the variable address in response to the bit detection signal.

17. The semiconductor memory device of claim 13, wherein, in the first bank group, a data access path through which data of next order is inputted or outputted is activated by the variable address when the latch bank signal is at the second level.

* * * * *